United States Patent
Coteus et al.

(10) Patent No.: US 8,909,878 B2
(45) Date of Patent: Dec. 9, 2014

(54) IMPLEMENTING TIMING ALIGNMENT AND SYNCHRONIZED MEMORY ACTIVITIES OF MULTIPLE MEMORY DEVICES ACCESSED IN PARALLEL

(75) Inventors: Paul W. Coteus, Yorktown, NY (US); Kyu-hyoun Kim, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 13/494,280

(22) Filed: Jun. 12, 2012

(65) Prior Publication Data

US 2013/0332680 A1 Dec. 12, 2013

(51) Int. Cl.
*G06F 12/00* (2006.01)
(52) U.S. Cl.
USPC .............. 711/154; 711/167; 710/52; 370/363
(58) Field of Classification Search
USPC ................. 711/154, 167; 710/52; 370/363
See application file for complete search history.

(56) References Cited

U.S. PATENT DOCUMENTS

| | | | |
|---|---|---|---|
| 5,416,741 A | 5/1995 | Ohsawa | |
| 5,436,912 A | 7/1995 | Lustig | |
| 5,646,897 A | 7/1997 | Yukutake et al. | |
| 6,119,249 A | 9/2000 | Landry | |
| 7,337,293 B2 | 2/2008 | Brittain et al. | |
| 7,622,948 B1 | 11/2009 | Wennekamp | |
| 7,673,093 B2 | 3/2010 | Bartley et al. | |
| 7,844,769 B2 | 11/2010 | Bartley et al. | |
| 7,908,451 B2 | 3/2011 | Larson | |
| 2004/0111542 A1* | 6/2004 | Noda | 710/52 |
| 2005/0286506 A1* | 12/2005 | LaBerge | 370/363 |

* cited by examiner

*Primary Examiner* — Mardochee Chery
(74) *Attorney, Agent, or Firm* — Joan Pennington

(57) ABSTRACT

A method and circuit for implementing synchronized memory activities of multiple memory devices being accessed in parallel, and a design structure on which the subject circuit resides are provided. Each memory circuit generates an internal status signal for predefined internal memory activities and provides an output signal coupled to the multiple memory devices. Each memory circuit monitors the generated internal status signal and the output signal of at least one of the multiple memory devices, and responsive to the monitored signals generates a control signal for adjusting operation of its memory activities to synchronize memory activities of the memory devices.

20 Claims, 13 Drawing Sheets

IMPLEMENTING TIMING ALIGNMENT AND SYNCHRONIZED MEMORY ACTIVITIES OF MULTIPLE MEMORY DEVICES ACCESSED IN PARALLEL

FIELD OF THE INVENTION

The present invention relates generally to the data processing field, and more particularly, relates to a method and circuit for implementing timing alignment and synchronized memory activities of multiple memory devices being accessed in parallel, and a design structure on which the subject circuit resides.

DESCRIPTION OF THE RELATED ART

Modern computer systems typically are configured with a large amount of memory in order to provide data and instructions to one or more processors in the computer systems. Main memory of the computer system is typically large, often many GB (gigabytes) and is typically implemented in DRAM.

Main memory typically is coupled to a processor with a memory controller, which may be integrated on the same device as the processor or located separate from the processor, often on the same MCM (multi-chip module) or PWB. The memory controller receives load or read commands and store or write commands from the processor and services those commands, reading data from main memory or writing data to main memory. Typically, the memory controller has one or more queues, for example, read queues and write queues. The read queues and write queues buffer information including one or more of commands, controls, addresses and data; thereby enabling the processor to have multiple requests including read and/or write requests, in process at a given time.

Memory systems can include dynamic random access memory (DRAM), non-volatile random access memory (NVRAM), such as phase change memory (PCM), a type of non-volatile random access memory, and flash memory, such as, NAND type flash memory.

DRAM requires periodic refreshing to maintain capacitance charge for storing data. Flash memory can be electrically erased and reprogrammed; however, flash memory has a finite number of program-erase cycles before memory wear causes deterioration of the storage integrity. A wear leveling technique often is provided in flash memory for dynamically remapping data block to spread write operations between sectors. PCM has a limited number of writes to each cell, and writes to PCM often include write leveling to enable uniformity in writes to different cells. PCM is slower than DRAM and often uses a delayed write technique.

There are some cases where a memory device needs to initiate an internal operation and then external access is blocked while such internal operation is ongoing. Examples for such internal operations include, for example, memory initiated DRAM refresh, wear leveling in flash memory, and delayed write in PCM.

Multiple memory devices working in parallel include, for example, a memory rank of a set of DRAMs connected to the same chip select. When multiple memory devices are accessed in parallel, a problem can result from different devices blocking external access in different times, so the total block out time can be very long. Therefore, a need exists to synchronize the internal activities of those multiple memory devices.

In other case, memory devices may have different latencies in clock cycles due to Process, Voltage and Temperature (PVT) variation. Therefore, a need exists to synchronize the internal activities or data access latencies of different memory devices.

A need exists for a circuit having an efficient and effective mechanism to implement timing alignment and synchronized memory activities of multiple memory devices being accessed in parallel.

SUMMARY OF THE INVENTION

Principal aspects of the present invention are to provide a method and circuit for implementing synchronized memory activities of multiple memory devices being accessed in parallel, and a design structure on which the subject circuit resides. Other important aspects of the present invention are to provide such method, circuit and design structure substantially without negative effects and that overcome many of the disadvantages of prior art arrangements.

In brief, a method and circuit for implementing synchronized memory activities of multiple memory devices being accessed in parallel, and a design structure on which the subject circuit resides are provided. Each memory circuit generates an internal status signal for predefined internal memory activities and provides an output signal coupled to the multiple memory devices. Each memory circuit compares the generated internal status signal and the output signal of at least one of the multiple memory devices, and responsive to the compared signals generates a control signal for adjusting operation of its memory activities to synchronize memory activities of the memory devices.

In accordance with features of the invention, the control signal is provided to adjust event period or access latency for the memory device.

In accordance with features of the invention, the multiple memory devices share a common wired-OR signal and the output busy signal drives the common wired-OR signal during its asynchronous event. Each memory device at the same time monitors the common wired-OR signal and when the memory device is the earliest device, the memory device adjusts its event period to increase the event period to start later. After a few iterations, all memory devices are synchronized automatically.

In accordance with features of the invention, alternatively each memory device at the same time monitors the common wired-OR signal and when the memory device is the latest device, the memory device adjusts its event period to decrease the event period to start earlier. After a few iterations, all memory devices are synchronized automatically.

In accordance with features of the invention, the memory devices are connected in a daisy chain. Each memory device drives its internal status signal to the next device. Each memory device at the same time receives the internal status signal from the previous device and when the memory device is earlier or later than the previous device. If the memory device is earlier, then the memory device adjusts its access latency or event period, so that the activity or the data output occurs later next time. After a few iterations, all memory devices are synchronized automatically.

In accordance with features of the invention, the multiple memory devices being accessed in parallel are synchronized automatically without any operation being required by a host controller.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

In accordance with features of the invention, a method and circuits for implementing synchronized memory activities of multiple memory devices being accessed in parallel, and a design structure on which the subject circuits reside are provided.

The present invention provides synchronized memory activities of all the multiple memory devices being accessed in parallel automatically without any operation being required by a host controller.

Figure 1:
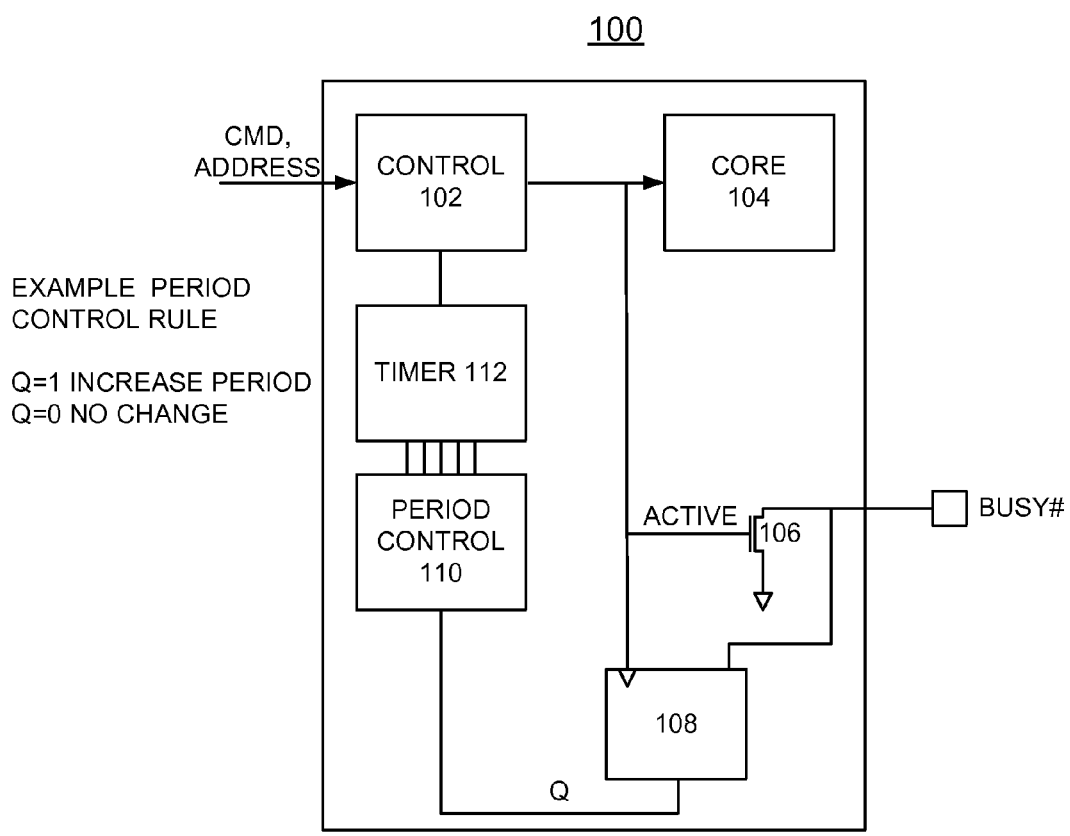
FIG. 1 provides a schematic and block diagram representation illustrating an example memory circuit for implementing synchronized memory activities of multiple memory devices being accessed in parallel in accordance with a preferred embodiment.

Having reference now to the drawings, in FIG. 1, there is shown an example memory circuit generally designated by the reference character 100 for implementing synchronized memory activities of multiple memory devices being accessed in parallel in accordance with a preferred embodiment.

Memory circuit 100 preferably is a semiconductor device and includes a control 102 receiving a command, address input and coupled to a memory core 104 including a plurality of memory cells. The control 102 is coupled to an N-channel field effect transistor (NFET) 106 and a timing compare 108, such as a negative edge triggered latch 108. Memory circuit 100 includes a period control 110 receiving an output control signal Q of the timing compare 108 and providing control inputs to a timer 112, which provides an adjusting input to the control 102.

Memory circuit 100 is shown in simplified form sufficient for understanding the invention. It should be understood that the present invention is not limited to use with the illustrated memory circuit 100 of FIG. 1. For example, a memory circuit as illustrated and described with respect to FIG. 4 and a memory circuit as illustrated and described with respect to FIG. 6 could be used in accordance with embodiments of the invention.

The control 102 generates an internal status signal ACTIVE for predefined internal memory activities applied to the NFET 106 and the timing compare 108. The internal active signal ACTIVE applies a high gate input to turn on the NFET 106 responsive to predefined internal activities of the memory circuit 100. The NFET 106 applies an output busy signal BUSY# of NFET 106 is applied to the timing compare 108.

Timing compare 108 monitors the internal status signal ACTIVE and the busy signal BUSY# of the multiple memory devices 202 and generates a control signal Q. The output control signal Q is applied to the period control 110 which provide a responsive input to the timer 112. The timer 112 provides a responsive input to the control 102 adjusting operation of memory activities of the memory circuit 100 to synchronize memory activities of multiple memory devices generating output busy signal BUSY#.

Figure 2:
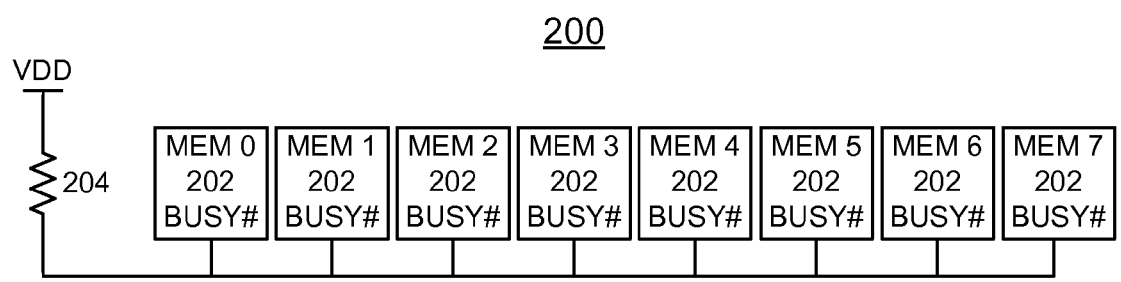
FIG. 2 provides a block diagram representation illustrating an example memory system with multiple memory circuits of FIG. 1 for implementing synchronized memory activities of multiple memory devices being accessed in parallel in accordance with a preferred embodiment.

Referring also to FIG. 2, there is shown an example memory system generally designated by the reference character 200 including multiple memory devices 202, for implementing synchronized memory activities of multiple memory devices being accessed in parallel in accordance with a preferred embodiment. Each memory device 202 includes memory circuit 100 to implement synchronized memory activities of the multiple memory devices 202.

Multiple memory devices 202 of the memory systems 200 are not limited to a particular memory type and can include dynamic random access memory (DRAM), non-volatile random access memory (NVRAM), such as phase change memory (PCM), a type of non-volatile random access memory, and flash memory, such as, NAND type flash memory.

For example, memory system 200 is a dynamic random access memory (DRAM) system 200 including a plurality of DRAMs 202 arranged, for example, as dual inline memory module (DIMM) circuit cards.

Each memory circuit 100 of the multiple memory devices 202 applies the output signal BUSY# to a dot connection driving a common wired-OR signal connected by a resistor 204 to a voltage rail VDD.

In operation of memory circuit 100 in the system 200, the memory circuit 100, for example, drives the BUSY# connection or pin low during its asynchronous event. Each memory circuit 100 of the multiple memory devices 202 at the same time monitors the common wired-OR signal BUSY# and one memory device that is the earliest device adjusts its event period so that it would happen a later next time. Each memory circuit 100 compares timing of the generated internal status signal ACTIVE and the common wired-OR signal BUSY# applied to the common wired-OR connection, and responsive to the compared timing signals generates the control signal Q of the timing compare 108, used for adjusting operation of its memory activities to synchronize memory activities of the memory devices.

The control signal Q is applied to the period control 110 to adjust event period or access latency for the memory device 202. For example, with a period control rule as shown in FIG. 1, with Q=1, the event period is increased, and with Q=0, no change is made to the event period. After a few iterations, all memory devices 202 are synchronized automatically. In accordance with features of the invention, the multiple memory devices 202 being accessed in parallel are synchronized automatically without any operation being required by a host controller.

Figure 3A:
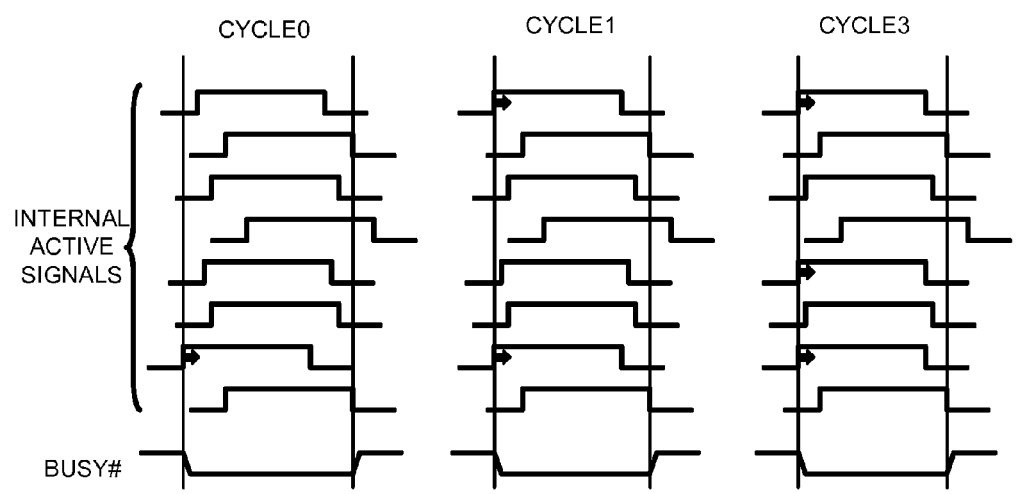
FIGS. 3A and 3B include example waveform diagrams illustrating example operations of the multiple memory circuits of FIG. 2 for implementing synchronized memory activities of multiple memory devices being accessed in parallel in accordance with a preferred embodiment.
Figure 3B:
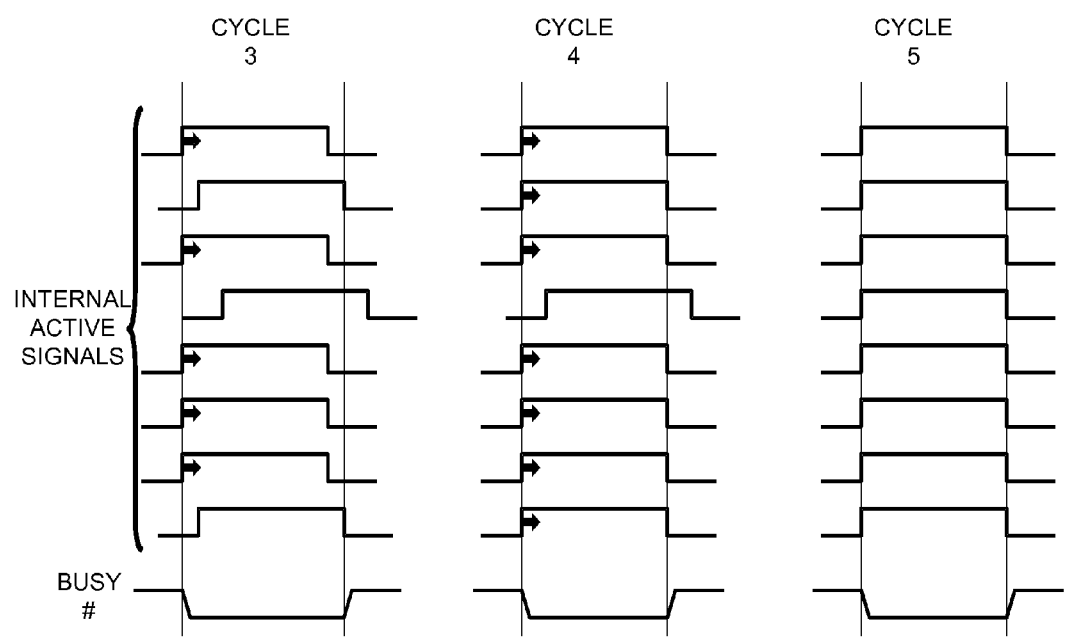

Referring to FIGS. 3A and 3B, there are shown example waveform diagrams illustrating example operations of the multiple memory circuits 100 for implementing synchronized memory activities of multiple memory devices being accessed in parallel in accordance with a preferred embodiment. In FIGS. 3A and 3B, there are shown example internal active signals together with a respective common wired-OR signal BUSY# from an initial cycle 0, with respective changes to the event period providing the illustrated example internal active signals in following cycles 1 through cycle 5. As shown, internal memory activities of all memory devices 202 are synchronized in cycle 5.

Figure 4:
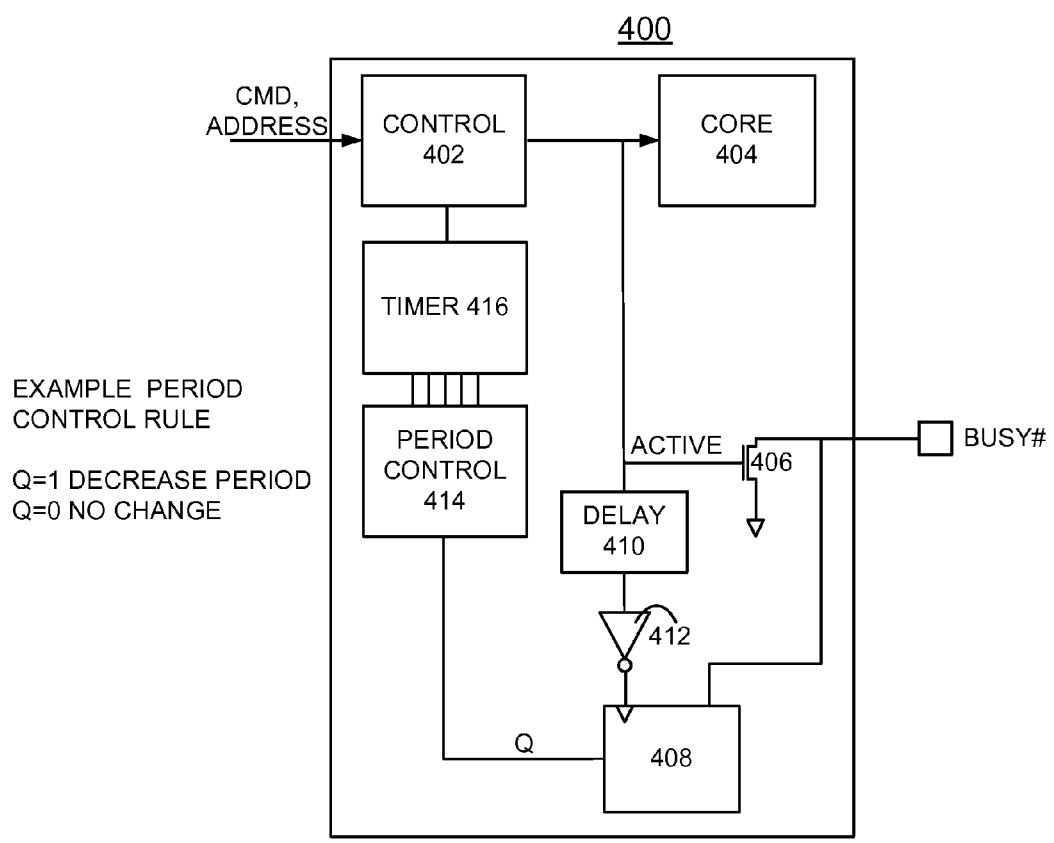
FIG. 4 provides a schematic and block diagram representation illustrating another example memory circuit for use for the multiple memory devices in the memory system of FIG. 2 for implementing synchronized memory activities of multiple memory devices being accessed in parallel in accordance with a preferred embodiment.

In accordance with features of the invention, alternatively each memory circuit at the same time monitors the common wired-OR signal and when the memory device is the latest device, the memory circuit adjusts its event period to decrease the event period to start earlier, for example in a memory circuit as illustrated and described with respect to FIG. 4. After a few iterations, all memory devices are synchronized automatically.

Referring to FIG. 4, there is shown another example memory circuit generally designated by the reference character 400 for use for the multiple memory circuits 202 in the memory system 200 for implementing synchronized memory activities of multiple memory devices being accessed in parallel in accordance with a preferred embodiment. Memory circuit 400 identifies the latest device, rather than the earliest device identified by memory circuit 100, and adjusts its event period to decrease the event period to start earlier, such as illustrated in the example waveforms of FIG. 5.

Memory circuit 400 preferably is a semiconductor device and includes a control 402 receiving a command, address input and coupled to a memory core 404 including a plurality of memory cells. The control 402 is coupled to an N-channel field effect transistor (NFET) 406 applying a generated internal status signal ACTIVE to a gate of the NFET 406. An output BUSY# of the NFET 406 driving the common wired-OR connection in system 200 is applied to a timing compare 408, such as a positive edge triggered latch 408. The generated internal status signal ACTIVE is coupled by a delay 410 and inverted by an inverter 412 and applied to the timing compare 408. Memory circuit 400 includes a period control 414 receiving an output control signal Q of the timing compare 408 and providing control inputs to a timer 416, which provides an adjusting input to the control 402 for synchronizing memory activities of multiple memory devices being accessed in parallel.

The control 402 generates the internal status signal ACTIVE for predefined internal memory activities applied to the NFET 406 and the internal status signal ACTIVE is delayed and inverted and applied to the timing compare 408. The internal active signal ACTIVE applies a high gate input to turn on the NFET 406 responsive to predefined internal activities of the memory circuit 400. Timing compare 108 monitors the delayed and inverted internal status signal ACTIVE and the busy signal BUSY# of the multiple memory devices 202 and generates the control signal Q. The output control signal Q applied to the period control 414 is used to adjust event period or access latency for each memory device, for example, with a period control rule as shown in FIG. 4, with Q=1, the event period is decreased, and with Q=0, no change is made to the event period. After a few iterations, all memory devices are synchronized automatically, for example as illustrated in FIG. 5.

Figure 5:
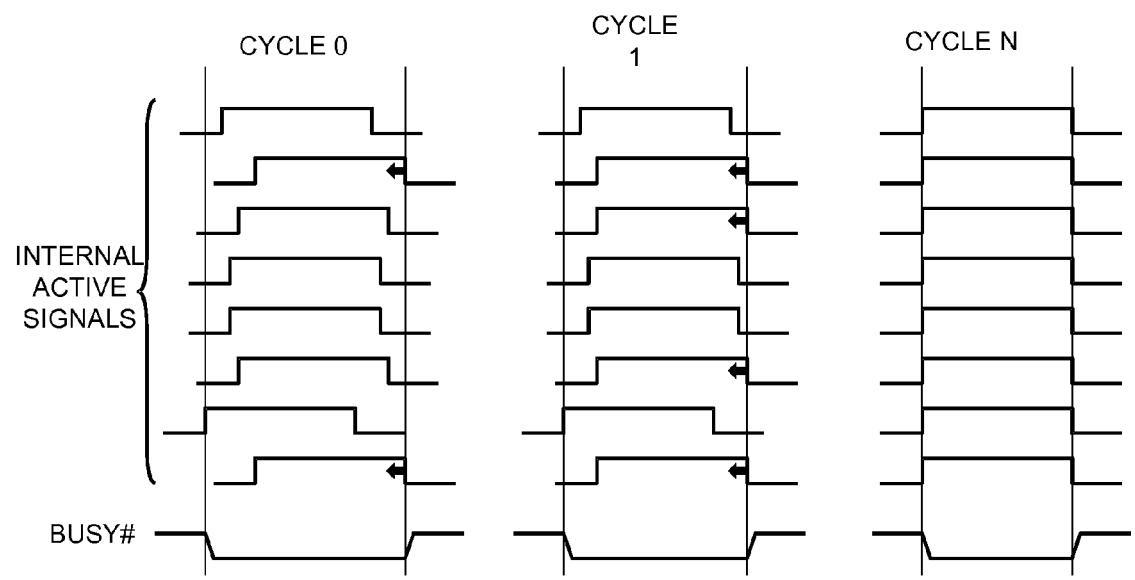
FIG. 5 includes example waveform diagrams illustrating example operations of the multiple memory circuits of FIG. 4 in the memory system of FIG. 2 for implementing synchronized memory activities of multiple memory devices being accessed in parallel in accordance with a preferred embodiment.

Referring to FIG. 5 there are shown example waveform diagrams illustrating example operations of the memory circuit 400 included in each of the multiple memory devices 202 in the memory system 200 for implementing synchronized memory activities of multiple memory devices being accessed in parallel in accordance with a preferred embodiment. Each memory device 202 includes the control circuit 400 that generates the internal active signal ACTIVE and the output signal BUSY#, and at the same time monitors the common wired-OR signal BUSY# and the inverted and delayed internal active signal ACTIVE; when the memory device is the latest device, the memory circuit 400 adjusts its event period with period control 414 and timer 416 to decrease the event period to start earlier. Example internal active signals are shown together with a respective common wired-OR signal BUSY# from an initial cycle 0, with respective changes to the event period providing the illustrated example internal active signals in following cycles 1 through cycle N. As shown, internal memory activities of all memory devices are synchronized in cycle N.

In accordance with features of the invention, the memory devices are connected in a daisy chain with each memory device driving its internal status signal to the next device. The memory devices may have different latencies in clock cycles due to PVT variation. Therefore, a need exists to synchronize the internal activities or data access latencies of different devices. Each memory device at the same time hears from the previous device and determines if the memory device is earlier than the previous device. If the memory device is earlier, then the memory device adjusts its access latency or event period, or so that the activity or the data output occurs later next time, for example, including a memory circuit as illustrated and described with respect to FIG. 6. After a few iterations, all memory devices can be synchronized automatically.

Figure 6:
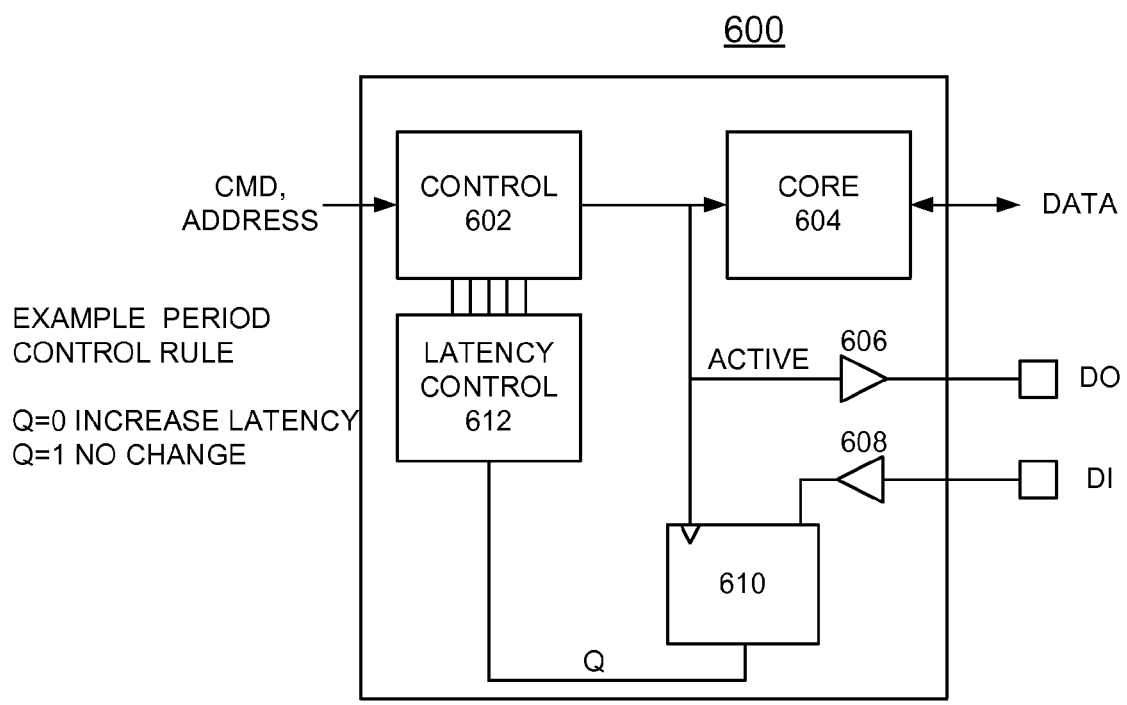
FIG. 6 provides a schematic and block diagram representation illustrating another example memory circuit for implementing synchronized memory activities of multiple memory devices being accessed in parallel in accordance with a preferred embodiment.

Referring to FIG. 6, there is shown another example memory circuit generally designated by the reference character 600 for implementing synchronized memory activities of multiple memory devices being accessed in parallel in accordance with a preferred embodiment.

Memory circuit 600 preferably is a semiconductor device and includes a control 602 receiving a command, address input and coupled to a memory core 604 including a plurality of memory cells. The control 602 applies a generated internal status signal ACTIVE to a buffer or driver 606 providing a data output DO to another memory device. A buffer 608 receiving a data input DI from another memory device is coupled a timing compare 610, which also receives the generated internal status signal ACTIVE corresponding to the data output DO. The timing compare 610 can be implemented, for example, with a D latch. The timing compare 610 monitors the data input DI and the generated internal status signal ACTIVE, providing an output control signal Q. Memory circuit 600 includes a latency control 612 receiving the control signal Q and applying latency inputs to the control 602 for synchronizing memory activities of multiple memory devices.

The control signal Q is applied to the latency control 612 to adjust event period or access latency for the memory device being accessed in parallel with multiple memory devices. For example, with a period control rule as shown in FIG. 6, with Q=0, the latency is increased and event period is increased, and with Q=1, no change is made to the latency or the event period. After a few iterations, all memory devices are synchronized automatically with the memory circuit 600. In accordance with features of the invention, the multiple memory devices being accessed in parallel are synchronized automatically without any operation being required by a host controller.

Figure 7:
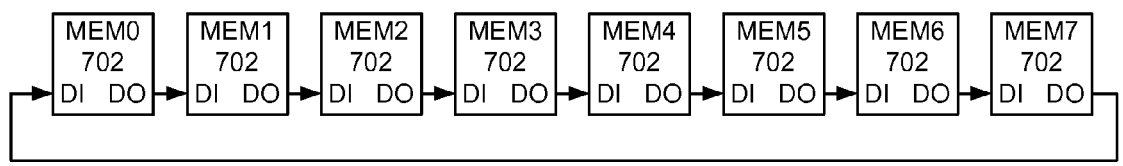
FIG. 7 provides a block diagram representation illustrating another example memory system with multiple memory devices connected in a daisy chain each including the memory circuit of FIG. 6 for implementing synchronized memory activities of multiple memory devices being accessed in parallel in accordance with a preferred embodiment.

Referring to FIG. 7, there is shown another example memory system generally designated by the reference character 700 with multiple memory devices 702 connected in a daisy chain, each memory device including a respective memory circuit 600 for implementing synchronized memory activities of the multiple memory devices 702 being accessed in parallel in accordance with a preferred embodiment.

All of the multiple memory devices 702 are connected in a daisy chain. Each memory device 702 drives its internal status output DO to the next device 702 in the memory system 700. Each device 702 at the same time monitors the previous device 702 receiving its data input DI from the previous memory device 702. The data input DI from a previous memory device 702 is coupled by the buffer 608 to the timing compare 610 in the memory circuit 600. Timing compare 610 monitors the generated internal status signal ACTIVE corresponding to data output DO and the data signal DI, and generates the control signal Q. The timing compare 610 of the memory device 702 compares the timing of its generated internal status signal ACTIVE corresponding to data output DO and the data signal DI. If the memory device 702 is earlier than the previous device 702 in the daisy chain, then timing compare 610, for example, provides the control Q=0 to increase latency of the memory device 702 to adjust the event period or its access latency so that the activity or the data output occurs later the next cycle, for example, as illustrated in the example waveforms of FIG. 8 and FIGS. 9A, 9B, and 9C.

Referring to FIG. 8 and FIGS. 9A, 9B, and 9C, there are shown example waveforms illustrating example operations of the multiple memory circuits 600 in the memory system 700 for implementing synchronized memory activities of multiple memory devices being accessed in parallel in accordance with a preferred embodiment.

Figure 8:
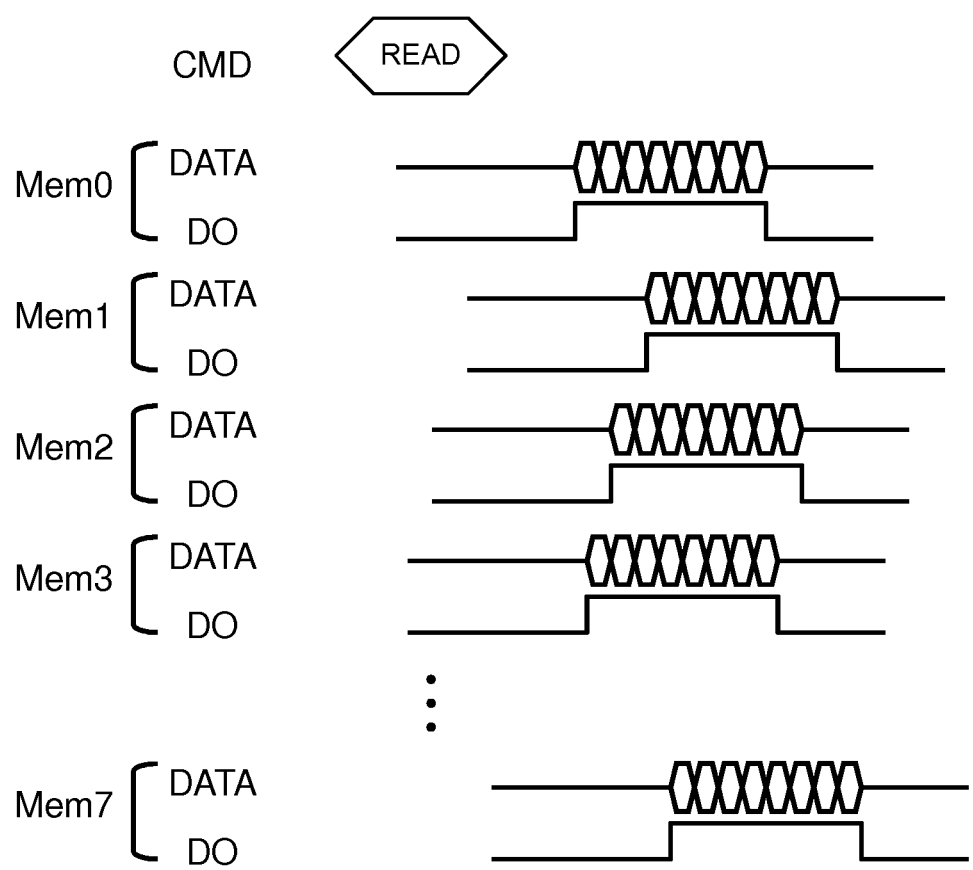
FIG. 8 and FIGS. 9A, 9B, and 9C include example waveform diagrams illustrating example operations of the multiple memory circuits of FIG. 6 in the memory system of FIG. 7 for implementing synchronized memory activities of multiple memory devices being accessed in parallel in accordance with a preferred embodiment.
Figure 9A:
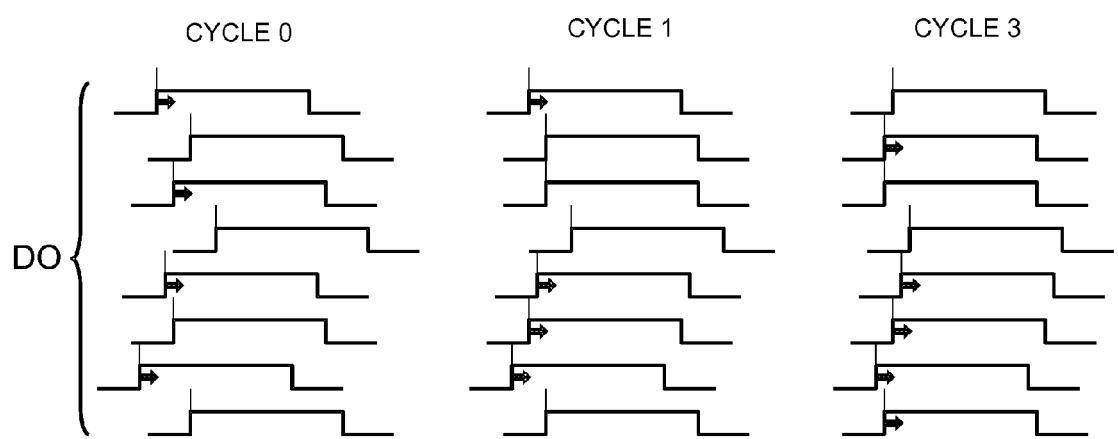
Figure 9B:
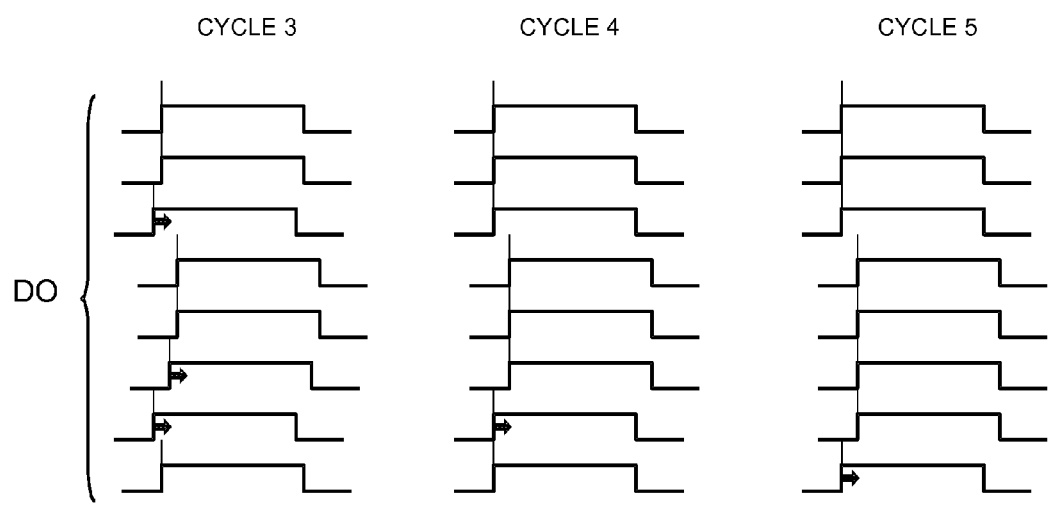
Figure 9C:
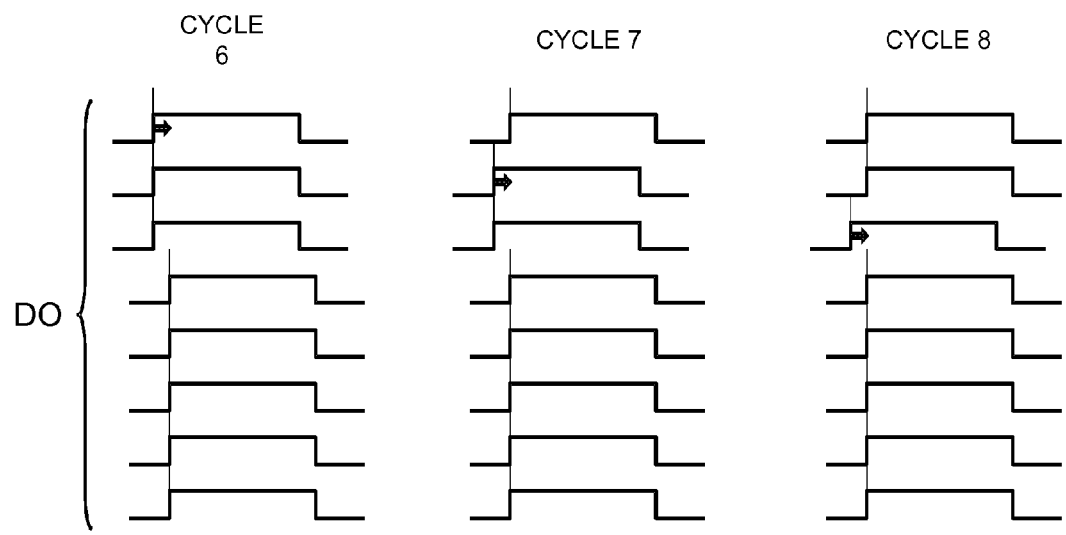

In FIG. 8, there are shown example waveforms illustrating a read operation. Example read data together with the internal status output DO are shown for each of the multiple memory devices 702, Mem0-Mem7. FIGS. 9A, 9B, and 9C illustrate example internal status output DO from for each of the multiple memory devices 702, Mem0-Mem7 starting with an initial cycle 0, with respective changes to the event period or access latency providing the illustrated example internal status output DO in following cycles 0 through cycle 8. As shown, internal memory activities of the memory devices 702, Mem0-Mem1, and memory devices 702, Mem3-Mem7 are synchronized in cycle 8, except for the memory device 702, Mem2, which will be synchronized in a next cycle or cycle 9, not shown.

Figure 10:
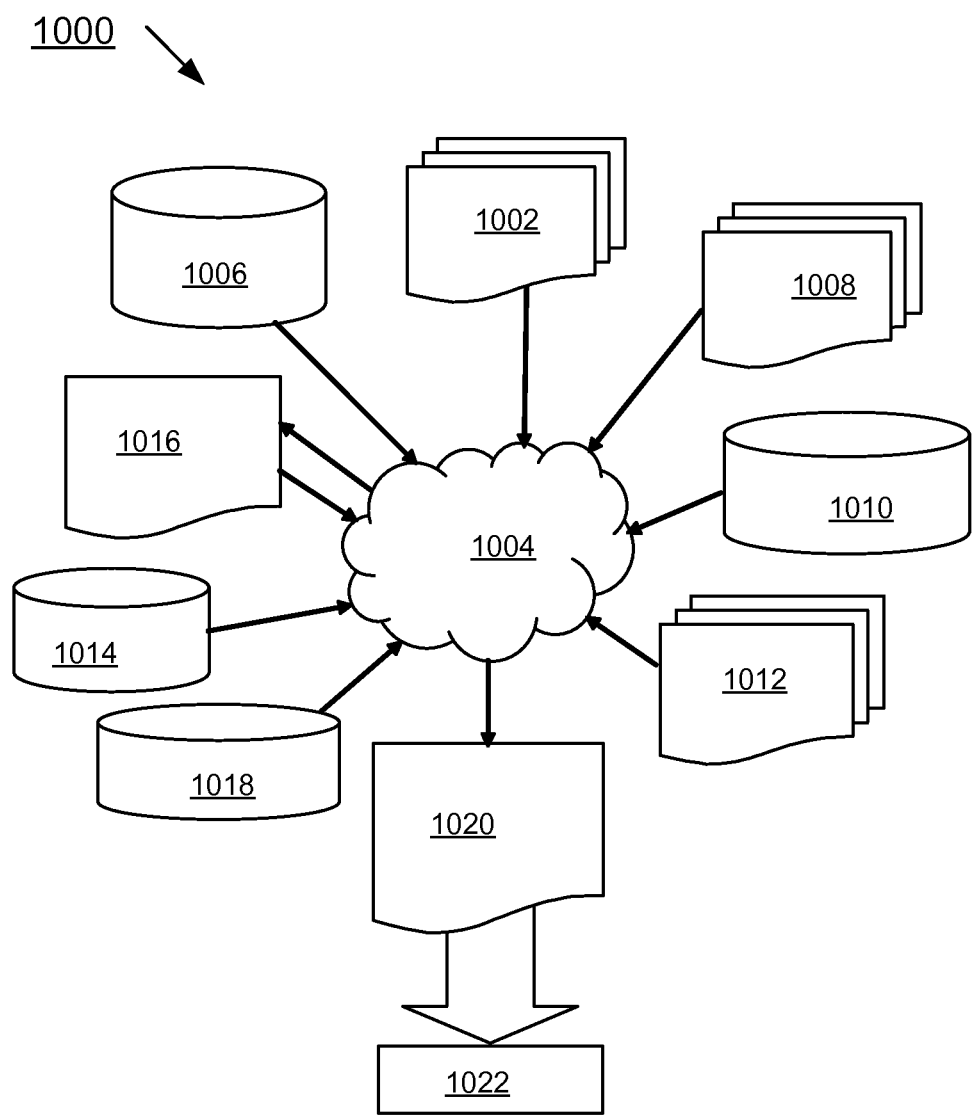
FIG. 10 is a flow diagram of a design process used in semiconductor design, manufacturing, and/or test.

FIG. 10 shows a block diagram of an example design flow 1000. Design flow 1000 may vary depending on the type of IC being designed. For example, a design flow 1000 for building an application specific IC (ASIC) may differ from a design flow 1000 for designing a standard component. Design structure 1002 is preferably an input to a design process 1004 and may come from an IP provider, a core developer, or other design company or may be generated by the operator of the design flow, or from other sources. Design structure 1002 comprises circuits 100, 200, 400, 600, and 700 in the form of schematics or HDL, a hardware-description language, for example, Verilog, VHDL, C, and the like. Design structure 1002 may be contained on one or more machine readable medium. For example, design structure 1002 may be a text file or a graphical representation of circuits 100, 200, 400, 600, and 700. Design process 1004 preferably synthesizes, or translates, circuits 100, 200, 400, 600, and 700 into a netlist 1006, where netlist 1006 is, for example, a list of wires, transistors, logic gates, control circuits, I/O, models, etc. that describes the connections to other elements and circuits in an integrated circuit design and recorded on at least one of machine readable medium. This may be an iterative process in which netlist 1006 is resynthesized one or more times depending on design specifications and parameters for the circuit.

Design process 1004 may include using a variety of inputs; for example, inputs from library elements 1008 which may house a set of commonly used elements, circuits, and devices, including models, layouts, and symbolic representations, for a given manufacturing technology, such as different technology nodes, 32 nm, 45 nm, 90 nm, and the like, design specifications 1010, characterization data 1012, verification data 1014, design rules 1016, and test data files 1018, which may include test patterns and other testing information. Design process 1004 may further include, for example, standard circuit design processes such as timing analysis, verification, design rule checking, place and route operations, and the like. One of ordinary skill in the art of integrated circuit design can appreciate the extent of possible electronic design automation tools and applications used in design process 1004 without deviating from the scope and spirit of the invention. The design structure of the invention is not limited to any specific design flow.

Design process 1004 preferably translates an embodiment of the invention as shown in FIGS. 1, 2, 4, 6, and 7 along with any additional integrated circuit design or data (if applicable), into a second design structure 1020. Design structure 1020 resides on a storage medium in a data format used for the exchange of layout data of integrated circuits, for example, information stored in a GDSII (GDS2), GL1, OASIS, or any other suitable format for storing such design structures.

Design structure 1020 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, 4, 6, and 7. Design structure 1020 may then proceed to a stage 1022 where, for example, design structure 1020 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing synchronized memory activities of multiple memory devices being accessed in parallel, said method comprising:
   providing a control function coupled to a memory core including a plurality of memory cells, said control function receiving a command, address input;
   said control function generating an internal status signal for predefined internal memory activities;
   providing a switch coupled to said control function for generating an output signal responsive to said generated internal status signal;
   monitoring said generated internal status signal and said output signal of at least one of the multiple memory devices; and
   generating a control signal responsive to the monitored signals, said control signal for adjusting an event period to synchronize memory activities of the memory devices.

2. The method as recited in claim 1 wherein the multiple memory devices share a common output signal connection and includes each said memory device providing an output busy signal driving said common output signal connection during its asynchronous event.

3. The method as recited in claim 2 includes providing a field effect transistor (PET) arranged for driving said common output signal connection responsive to said generated internal status signal.

4. The method as recited in claim 2 wherein generating said control signal responsive to the monitored signals includes generating said control signal for increasing its event period.

5. The method as recited in claim 2 wherein generating said control signal responsive to the monitored signals includes generating said control signal for decreasing its event period.

6. The method as recited in claim 1 wherein the memory devices are connected in a daisy chain; and includes each said memory device providing said output signal corresponding to its internal status signal to a next device in the daisy chain.

7. The method as recited in claim 6 wherein generating said control signal responsive to the monitored signals includes each said memory device at the same time monitoring said output signal received from a previous memory device in said daisy chain and when the memory device is earlier than the previous memory device, generating said control signal to adjust its event period to increase the event period or its access latency of the memory activity to occur later.

8. The method as recited in claim 1 wherein said control signal is used to adjust event period or access latency for the memory device responsive to compared timing of said generated internal status signal and said output signal.

9. A circuit for implementing synchronized memory activities of multiple memory devices being accessed in parallel comprising:
   a memory control logic coupled to a memory core including a plurality of memory cells receiving a command, address input; said control function generating an internal status signal for predefined internal memory activities and coupled to a switch for generating an output signal;
   a timing compare monitoring said generated internal status signal and said output signal of at least one of the multiple memory devices and generating a control signal responsive to the monitored signals, said control signal for adjusting an event period to synchronize memory activities of the memory devices.

10. The circuit as recited in claim 9 wherein the multiple memory devices share a common output signal connection and said output signal is an output busy signal driving said common output connection during its asynchronous event.

11. The circuit as recited in claim 10 wherein said timing compare of each said memory device at the same time monitors said common output signal connection and said timing compare of the memory device adjusts its event period to increase the event period.

12. The circuit as recited in claim 10 wherein said timing compare of each said memory device at the same time monitors said common output signal connection and said timing compare of the memory device adjusts its event period to decrease the event period.

13. The circuit as recited in claim 10 wherein said switch coupled to said memory control logic of each said memory device includes a field effect transistor (PET) driving said common output signal connection during its asynchronous event.

14. The circuit as recited in claim 9 wherein the memory devices are connected in a daisy chain; and said memory control logic of each said memory device drives said output signal corresponding to its internal status signal to a next device in the daisy chain.

15. The circuit as recited in claim 14 wherein said timing compare of each said memory device at the same time monitors said output signal received from another memory device in said daisy chain and when the memory device is earlier, said generated control signal of said timing compare adjusts the event period to increase the event period or its access latency of the memory activity.

16. The circuit as recited in claim 9 wherein said generated control signal is used to adjust event period or access latency for the memory device responsive to compared timing of said generated internal status signal and said output signal.

17. A design structure embodied in a non-transitory machine readable storage medium used in a design process, the design structure comprising:
   a circuit tangibly embodied in the machine readable storage medium used in the design process, said circuit for implementing synchronized memory activities of multiple memory devices being accessed in parallel, said circuit comprising:
   a memory control logic coupled to a memory core including a plurality of memory cells receiving a command, address input; said control logic generating an internal status signal for predefined internal memory activities and coupled to a switch for generating an output signal;
   a timing compare monitoring said generated internal status signal and said output signal of at least one of the multiple memory devices and generating a control signal responsive to the monitored signals, said control signal for adjusting an event period to synchronize memory activities of the memory devices, wherein the design structure, when read and used in the manufacture of a semiconductor chip produces a chip comprising said circuit.

18. The design structure of claim 17, wherein the design structure comprises a netlist, which describes said circuit.

19. The design structure of claim 17, wherein the design structure resides on storage medium as a data format used for the exchange of layout data of integrated circuits.

20. The design structure of claim 17, wherein the design structure includes at least one of test data files, characterization data, verification data, or design specifications.

* * * * *